United States Patent
Boyd et al.

(10) Patent No.: US 7,503,983 B2
(45) Date of Patent: Mar. 17, 2009

(54) METHODS OF PROXIMITY HEAD BRUSHING

(75) Inventors: John M. Boyd, Atascadero, CA (US); Michael L. Orbock, Beaverton, OR (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/008,552

(22) Filed: Jan. 11, 2008

(65) Prior Publication Data

US 2008/0105277 A1      May 8, 2008

Related U.S. Application Data

(62) Division of application No. 10/742,303, filed on Dec. 18, 2003, now Pat. No. 7,353,560.

(51) Int. Cl.
*B08B 1/00* (2006.01)

(52) U.S. Cl. ................... 134/6; 134/15; 134/21; 134/24; 134/26; 134/32; 134/33; 134/34; 134/36; 134/37; 134/42; 134/902; 15/88.2; 15/88.3; 15/88.4

(58) Field of Classification Search ............ 15/88.2, 15/88.3, 88.4; 134/6, 15, 21, 24, 26, 32, 134/33, 34, 36, 37, 42, 902
See application file for complete search history.

(56) References Cited

U.S. PATENT DOCUMENTS

| | | | | | |
|---|---|---|---|---|---|
| 5,361,449 | A | * | 11/1994 | Akimoto | 15/302 |
| 5,806,126 | A | * | 9/1998 | de Larios et al. | 15/102 |
| 5,858,112 | A | * | 1/1999 | Yonemizu et al. | 134/6 |
| 6,167,583 | B1 | * | 1/2001 | Miyashita et al. | 15/77 |
| 6,488,040 | B1 | * | 12/2002 | de Larios et al. | 134/95.2 |
| 7,000,622 | B2 | * | 2/2006 | Woods et al. | 134/94.1 |
| 2004/0069329 | A1 | * | 4/2004 | de Larios et al. | 134/95.2 |

\* cited by examiner

*Primary Examiner*—Sharidan Carrillo
(74) *Attorney, Agent, or Firm*—Martine Penilla & Gencarella, LLP

(57) ABSTRACT

A wafer preparation method is provided for producing a wet region and then a corresponding dry region on the wafer. Brushing produces the wet region on the wafer. As the brushing moves in a selected scan operation across the wafer, a generating operation forms a meniscus that follows the brushing and dries the wet region. The generating operation produces the meniscus at least partially surrounding the wet region scrubbed by the scrubbing. The controlled meniscus is formed by applying fluid to the surface of the wafer and simultaneously removing the fluid. The scan operations may be selected so the brushing scrubs the wet region and then the meniscus forms the dry region where the scrubbing took place. The scan operations include a radial scan, a linear scan, a spiral scan and a raster scan.

17 Claims, 11 Drawing Sheets

METHODS OF PROXIMITY HEAD BRUSHING

CROSS-REFERENCE TO RELATED APPLICATION

This Application is a Divisional of application Ser. No. 10/742,303, filed on Dec. 18, 2003 now U.S. Pat. No. 7,353,560 (the "prior application"), from which priority under 35 U.S.C. § 120 is claimed. The disclosure of the prior application is incorporated herein by reference.

BACKGROUND OF THE INVENTION

1. Field of the Invention

The present invention relates to semiconductor wafer processing, and more specifically to optimizing semiconductor wafer cleaning and drying in an integrated unit.

2. Description of the Related Art

Typically, semiconductor wafer fabrication entails multiple processing operations. For example, the processing operations can include many repeated steps, such as implantation, photolithography, material deposition, planarization, and related etching. In between the multiple processing operations, cleaning must be performed to ensure the removal of particulates and unwanted material that adhere to the wafer. Exemplary particulates that can adhere to the surface of the wafer can include silicon dust, silica, slurry residue, polymeric residue, metal flakes, atmospheric dust, plastic particles, and silicate particles.

Cleaning the wafer typically includes the use of deionized water (DIW), chemicals, and chemicals with DIW applied to wafer surfaces using mechanical contact, such as brush scrubbing. The application of the chemicals can also occur by completely immersing the wafer in a chemical or spraying the chemical on the wafer. However, while chemical processing removes most particulates and unwanted material, there may be times when not all particulates or material are removed to the desired degree.

Following the chemical cleaning process, the wafer may be subjected to a spin, rinse and dry (SRD) cycle to further remove chemical residues or particulates. The wafer then exits the SRD cycle in a dry state and ready for the next processing step. This cycle then repeats for any number of layers needed to fabricate a desired integrated circuit device being made from the wafer.

FIG. 1 is a diagram illustrating a wafer cleaning system with brushes. The wafer cleaning system shows a wafer 100 rotating with a wafer spin 110 while disposed between a first brush 120 and a second brush 130, both brushes having multiple nodules 160. First brush 120 has a first through the brush (TTB) conduit 140 and is shown having a first brush rotation 125. Correspondingly, second brush 130 has a second TTB conduit 150 having a second brush rotation 135. While the brushes rotate in the directions shown, thus mechanically assisting in the removal of unwanted material, a chemical can be applied via first TTB conduit 140 and second TTB conduit 150 to chemically remove unwanted material.

The wafer cleaning system is typically housed within a containment chamber to prevent unwanted contamination of the semiconductor wafer fabrication environment. However, by design, brush cleaning will spray processing chemicals and water all over the containment chamber. This spraying, although common in brush scrubbing systems, can have the downside of introducing contaminants from prior scrub brush operations onto later processed wafers. Unfortunately, common prior art brush scrubbing will necessarily spray the process chemicals or water throughout the containment chamber during a brush scrubbing step.

In some processing configurations, brush scrubbing may only be done on one side of the wafer, such as the bottom side. In such cases, either no processing or application of another processing technology is used on the other side of the wafer. Although this is may be done, it is a common objective to not contaminate one side of the wafer with processing being done on the other side. That is, if brush scrubbing is being done on the bottom of the wafer, then it is generally undesirable to allow spraying or dripping of brush fluids on the top side. Although undesirable, such cross-contamination of backside to front side may necessarily occur due to the nature of the rotating brush.

Further, although this process can achieve the intended purpose of removing most unwanted material, the wafer cleaning system can leave residual chemicals or water on the wafer even after the SRD cycle. For example, residual chemicals can remain on the wafer, causing imperfections similar to water spots. These imperfections may then remain under subsequent deposition and etching processes. Cumulatively, the imperfections may, in some situations, cause faults in the electrical connections of circuits being formed in the wafer. Of course, this may result in lower yields from the resulting wafer.

Accordingly, what is needed is an apparatus and method to remove imperfections introduced by the wafer cleaning system while continuing to remove unwanted material from the wafer.

SUMMARY OF THE INVENTION

Broadly speaking, the present invention is a proximity brush unit for optimizing semiconductor wafer cleaning and drying. It should be appreciated that the present invention can be implemented in numerous ways, including as a process, an apparatus, a system, a device or a method. Several inventive embodiments of the present invention are described below.

In one embodiment, an apparatus has a head proximate to a surface of a wafer, a plurality of ports disposed on a surface of the head, such that the plurality of ports is capable of interfacing a first plurality of fluids to the surface of the wafer. Further, the brush disposed within the head is capable of being placed in contact with the surface of the wafer with the brush being partially contained by adjacent ones of the plurality of ports.

In another embodiment, a proximity brush unit has a plurality of ports capable of interfacing a first fluid, a second fluid and a third fluid on a surface of a substrate, to create a meniscus. Thereafter, the proximity brush unit has a rotatable brush adjacent to the plurality of ports, the rotatable brush being capable of delivering a fourth fluid to the surface of the substrate, the meniscus at least partially containing the rotatable brush and the fourth fluid.

The proximity brush unit can also be used in a method with the operations of providing a brush, partially surrounding the brush with a plurality of meniscus forming conduits, and applying the plurality of meniscus forming conduits proximate to a wafer surface. The operations also include scrubbing the wafer surface using the brush and activating the plurality of meniscus forming conduits to contain fluids at least partially around the brush, and scanning the wafer.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An apparatus and method for an optimal semiconductor wafer cleaning system is disclosed. Specifically, by using a partially enclosed brush that is proximate to a wafer surface in combination with a meniscus for drying the wafer surface, the wafer surface can be cleaned and dried while drastically reducing spraying and the propagation of impurities. The meniscus is as disclosed in U.S. Pat. No. 7,234,477 issued on Jun. 26, 2007 and entitled "Method and Apparatus for Drying Semiconductor Wafer Surfaces Using a Plurality of Inlets and Outlets Held In Close Proximity to the Wafer Surfaces", which patent is incorporated herein by reference in its entirety. It will be obvious, however, to one skilled in the art, that the present invention may be practiced without some or all of these specific details. In other instances, well known process operations have not been described in detail in order not to unnecessarily obscure the present invention.

Figure 1:
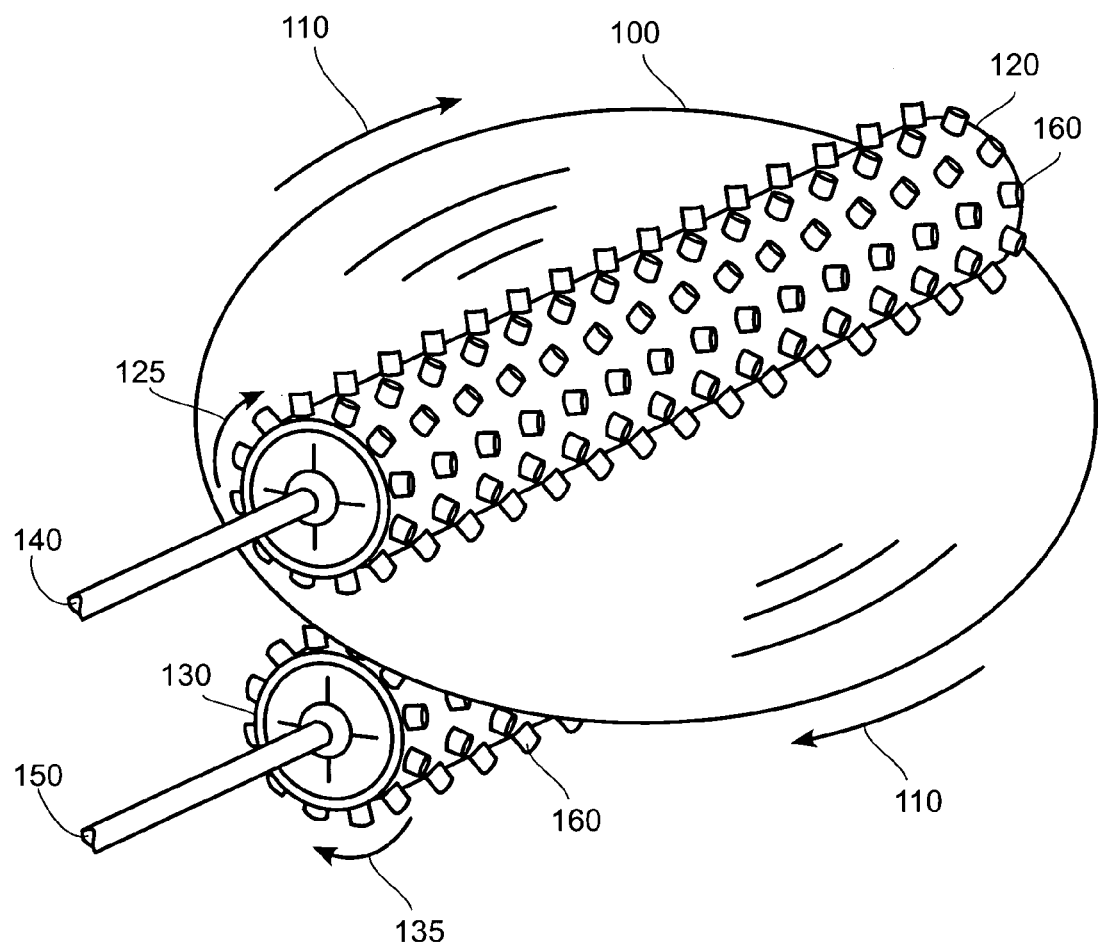
FIG. 1 is a diagram illustrating a wafer cleaning system with brushes.
Figure 2A:
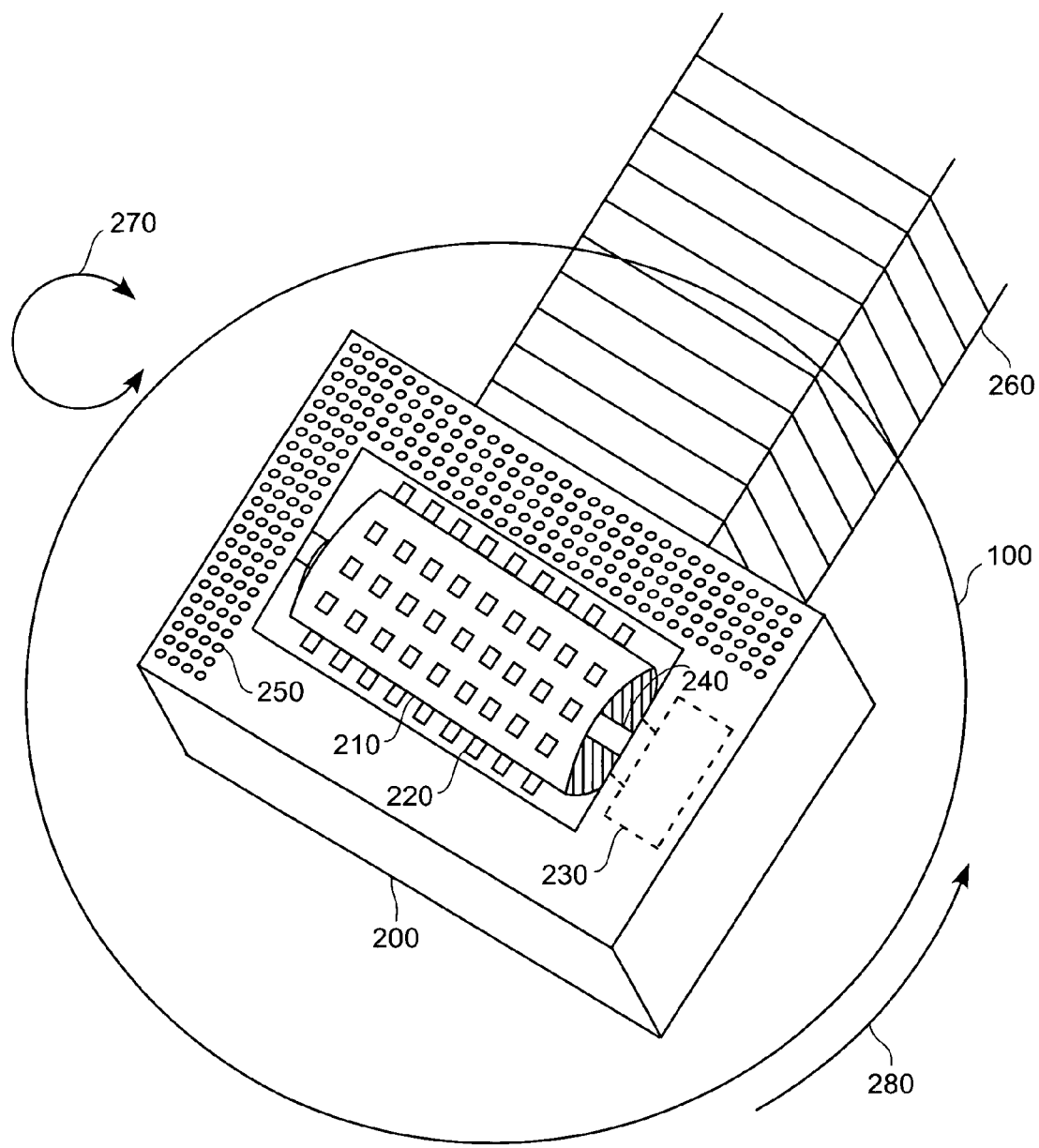
FIG. 2A is a diagram illustrating a proximity brush unit with mechanical gears, in accordance with an embodiment of the invention.

FIG. 2A is a diagram illustrating a proximity brush unit with mechanical gears, in accordance with an embodiment of the invention. Wafer 100 spins in a direction shown by a wafer rotation 280. Wafer 100 can be viewed as a substrate that is processed during processing operations. In some instances, the substrate can take on different shapes, such as square or rectangular shapes, as are used in flat panel substrates. For simplicity, reference will be made to a circular wafer, such as wafer 100. The actual diameter of a wafer can vary, and current technology examples include 200 mm wafers, 300 mm wafers, or larger. Disposed proximately beneath wafer 100 is a proximity brush unit (PBU) 200 attached to a single arm 260. Single arm 260 moves PBU 200 using various scanning methods to cover the entire surface of wafer 100, as later shown in FIGS. 4A and 4B.

PBU 200 includes a brush 210 having a plurality of nodules 220. Although shown with circular geometric shapes having an even distribution on brush 210, plurality of nodules 220 can take on any shape. All the shapes can be densely populated with an even distribution across brush 210 or can be sparsely populated with an uneven distribution. Any combination of distributing the shapes is possible, as long as the combination facilitates cleaning. In another embodiment, as later shown in FIG. 6, brush 210 can touch wafer 100 without using plurality of nodules 220, as long as enough contact exists between brush 210 and wafer 100 to facilitate mechanical cleaning.

Further, although brush 210 is shown having a cylindrical, roller-pin type shape, brush 210 can be any geometric shape such as a circular, pancake-style shape. Brush 210 also includes a through the brush (TTB) mechanism 240 disposed through the center of brush 210. TTB mechanism 240 can apply a plurality of fluids, such as a cleaning chemistry, through brush 210. The cleaning chemistry can include SC1, hydrofluoric acid (HF), ESC 784, a surfactant, deionized water (DIW), DIW with a surfactant, or some other chemical capable of chemically cleaning wafer 100.

Attached to TTB mechanism 240 is a mechanical gear 230. An opposing mechanical gear 230 (not shown) is also attached to TTB mechanism 240 on the opposite end of brush 210. Mechanical gears 230 can rotate brush 210 in a brush rotation 270 or keep brush 210 fixed. Further, mechanical gears 230 can move brush 210 up and down within PBU 200, permitting more or less contact with wafer 100. Ultimately, mechanical gears 230 can move brush 210 away from wafer 100, thus permitting no contact with wafer 100.

PBU 200 also includes a plurality of ports 250 disposed on the surface of PBU 200, permitting fluids produced from plurality of ports 250 to contact wafer 100 while partially enclosing brush 210. The fluids dry wafer 100 in conjunction with the wetting and scrubbing motion of brush 210. Further, controlling the fluids produces a stable fluid meniscus, as later shown in FIG. 3. Although shown with an approximate L-shaped configuration, plurality of ports 250 can have other shapes, such as an approximate U-shape or approximate O-shape. Further, plurality of ports 250 can have other shapes and configurations, as discussed in later figures.

Although disposed proximately beneath wafer 100, PBU 200 can also be disposed proximately above wafer 100. Further, one PBU 200 can be proximately disposed on each side of wafer 100, thus simultaneously permitting cleaning and drying of opposing surfaces on wafer 100. Alternatively, PBU 200 can be disposed between two wafers 100 if PBU 200 includes the configuration as shown in FIG. 2A on the underside of PBU 200.

Figure 2B:
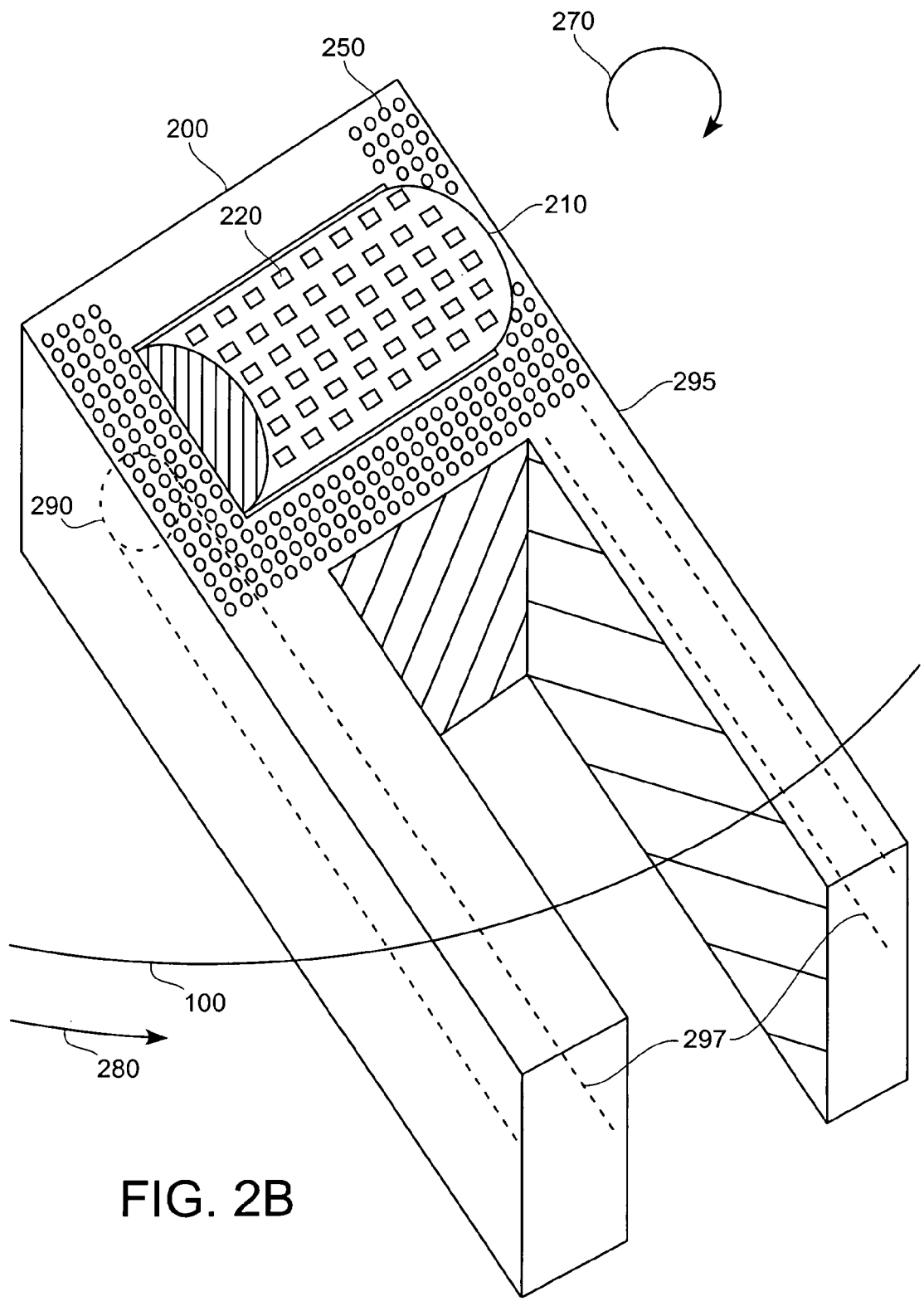
FIG. 2B is a diagram illustrating a proximity brush unit with a levitating brush, in accordance with an embodiment of the invention.

Alternatively, FIG. 2B is a diagram illustrating a proximity brush unit with a levitating brush, in accordance with an embodiment of the invention. Disposed beneath wafer 100 is PBU 200 with a dual arm 295. Dual arm 295 includes an electro-magnetic motor 290 located near each opposing end of brush 210. Along the length of each arm of dual arm 295 is a gear drive 297, permitting electro-magnetic motor 290 to levitate and rotate brush 210. Dual arm 295 moves PBU 200 with a scanning method, to cover the entire surface of wafer 100 as wafer 100 spins with wafer rotation 280. An advantage of using a levitating brush instead of a fixed motorized brush, as shown in FIG. 2A, is that levitating the brush 210 may produce a cleaner environment. Specifically, if brush 210 rotates via levitation, then mechanical gears 230 do not generate particulates that may contaminate wafer 100.

In one embodiment, PBU 200 has plurality of ports 250 in an approximate U-shaped configuration. Of course, other orientations, such as the approximate L-shape may be used. Although shown with two rows of plurality of ports 250 intersecting at 90-degree angles at two points, other embodiments of PBU 200 can have plurality of ports 250 intersecting at angles between 0 and 180 degrees. Thus, plurality of ports 250 can be a straight line having a 0/180 degree angle, can be a shape having an acute angle of 25-degrees, or can be a circular shape on PBU 200. Further, although plurality of ports 250 is shown having rows that extend along the full length of an edge of PBU 200, the rows can be any length.

As wafer 100 spins in the direction of wafer rotation 280, electro-magnetic motor 290 engages and levitates brush 210 out of the center of PBU 210, causing brush 210 contact with wafer 100. Then, brush 210 rotates with brush rotation 270 during the application of the cleaning chemistry to chemically and mechanically clean wafer 100. Subsequently, the stable fluid meniscus formed from the plurality of ports 250 dries the wet region created by brush 210.

Figure 2C:
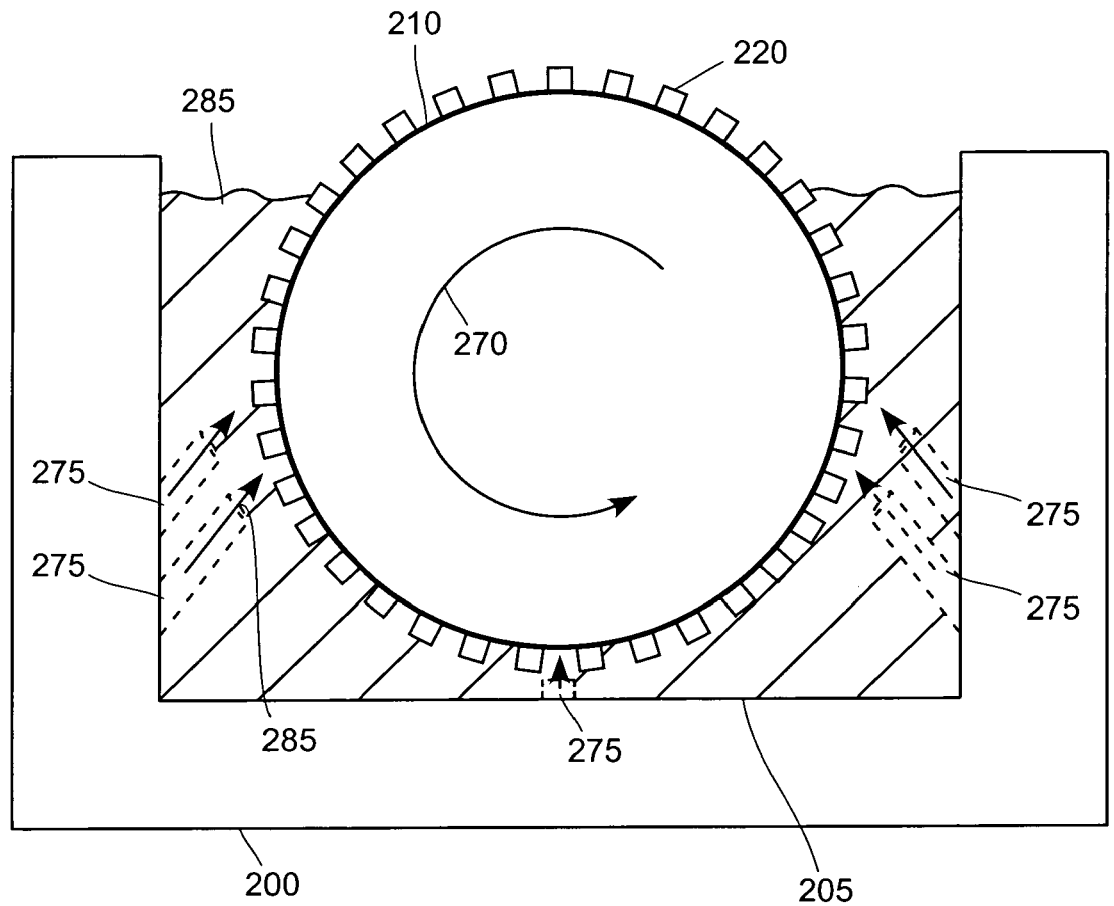
FIG. 2C is a diagram illustrating a cross section of a proximity brush unit with nozzles, in accordance with an embodiment of the invention.

FIG. 2C is a diagram illustrating a cross section of a proximity brush unit with nozzles, in accordance with an embodiment of the invention. PBU 200 contains brush 210 within a containment chamber 205. In one embodiment, a cleaning fluid 285 partially encloses brush 210, thus wetting brush 210 during brush rotation 270. Cleaning fluid 285 can be one of the plurality of fluids, such as the cleaning chemistry, as described in relation to FIG. 2A. At least one nozzle 275, located anywhere within containment chamber 205, provides cleaning fluid 285. In an alternative embodiment, containment chamber 205 can be dry and nozzle 275 can provide cleaning fluid 285 to brush 210.

Figure 3:
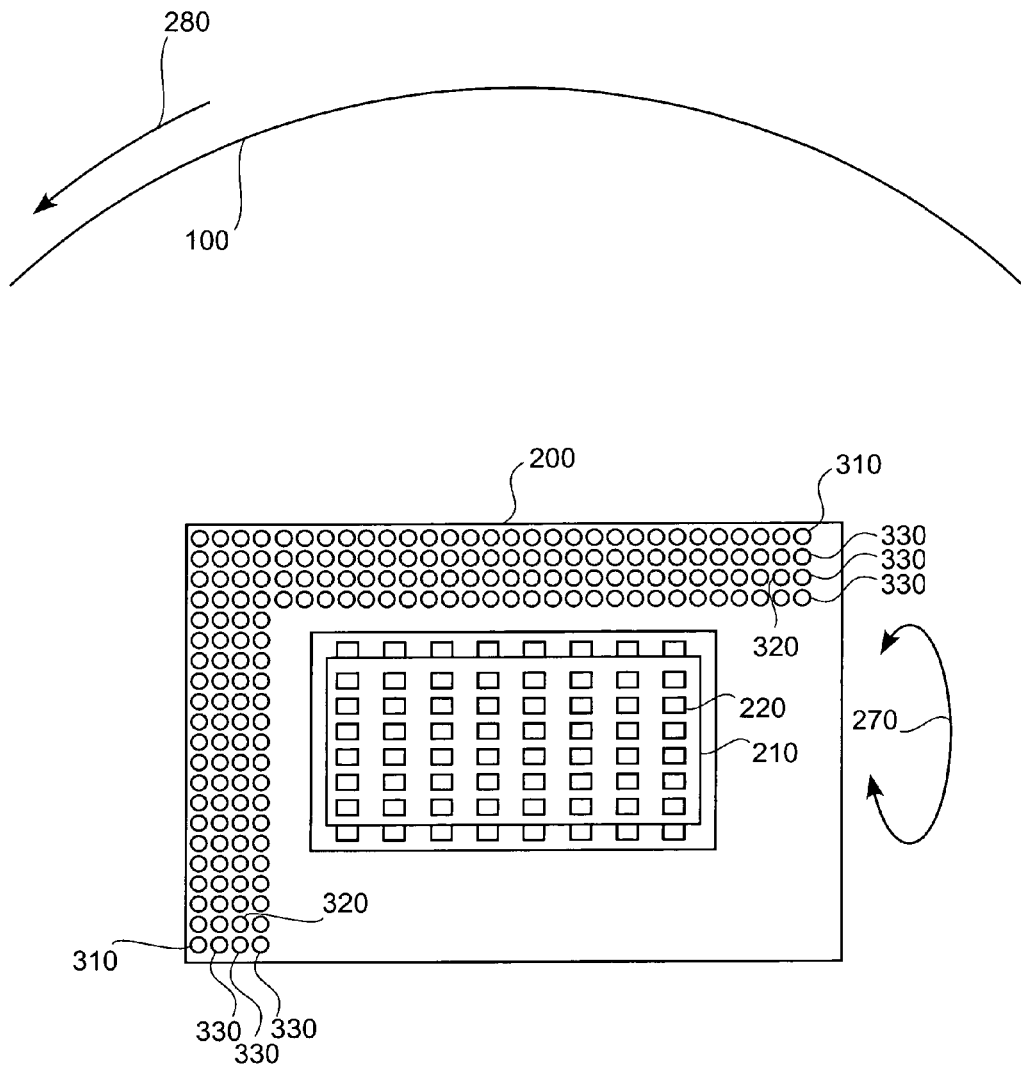
FIG. 3 is a diagram illustrating a top view of a proximity brush unit with a plurality of ports, in accordance with an embodiment of the invention.

FIG. 3 is a diagram illustrating a top view of a proximity brush unit with a plurality of ports, in accordance with an embodiment of the invention. Plurality of ports 250 is shown with rows of multiple ports including a first port 310, a second port 320, and a third port 330. All the ports can produce controllable fluids that form a stable fluid meniscus. Alternatively, some of the ports can produce fluids, as long as some of the ports produce the stable fluid meniscus. First port 310 produces isopropyl alcohol (IPA) vapor, second port 320 produces deionized water (DIW), and third port 330 produces a vacuum. Alternatively, second port 320 can produce a chemical or a chemical and DIW. The chemical can be cleaning fluid 285 or some other chemical solution used to form the stable fluid meniscus. A row of second ports 320 is completely surrounded by rows of third ports 330. Accordingly, as second ports 320 produce fluid, the vacuum created by third ports 330 removes fluid. Further, a row of first ports 310 trails the row of third ports 330 to help form the stable fluid meniscus. Accordingly, as PBU 200 moves across wafer 100, the stable fluid meniscus dries wafer 100 after brush 210 performs a cleaning operation.

Figure 4A:
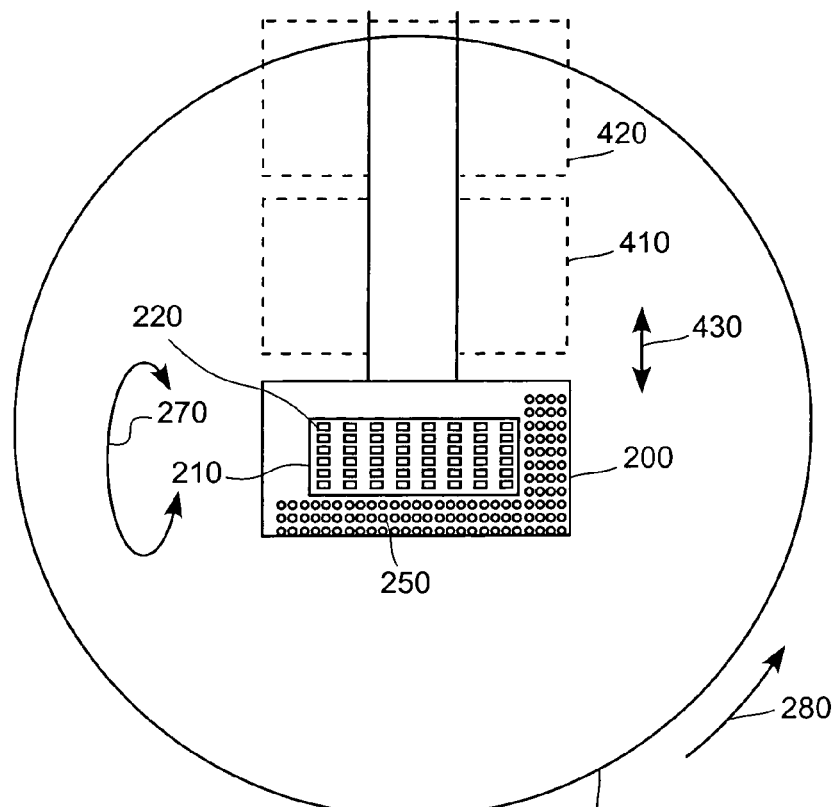
FIG. 4A is a diagram illustrating a proximity brush unit moving in a linear scan, in accordance with an embodiment of the invention.

FIG. 4A is a diagram illustrating a proximity brush unit moving in a linear scan, in accordance with an embodiment of the invention. As plurality of ports 250 produces the stable fluid meniscus, PBU 200 moves in the direction of a linear scan 430. During linear scan 430, brush 210 cleans wafer 100. Specifically, as wafer 100 rotates with wafer rotation 280, PBU 200 moves from the center of wafer 100 to a first linear scan location 410 followed by movement to a second linear scan location 420. Consequently, the stable fluid meniscus dries the wet region formed on wafer 100 by brush 210.

Figure 4B:
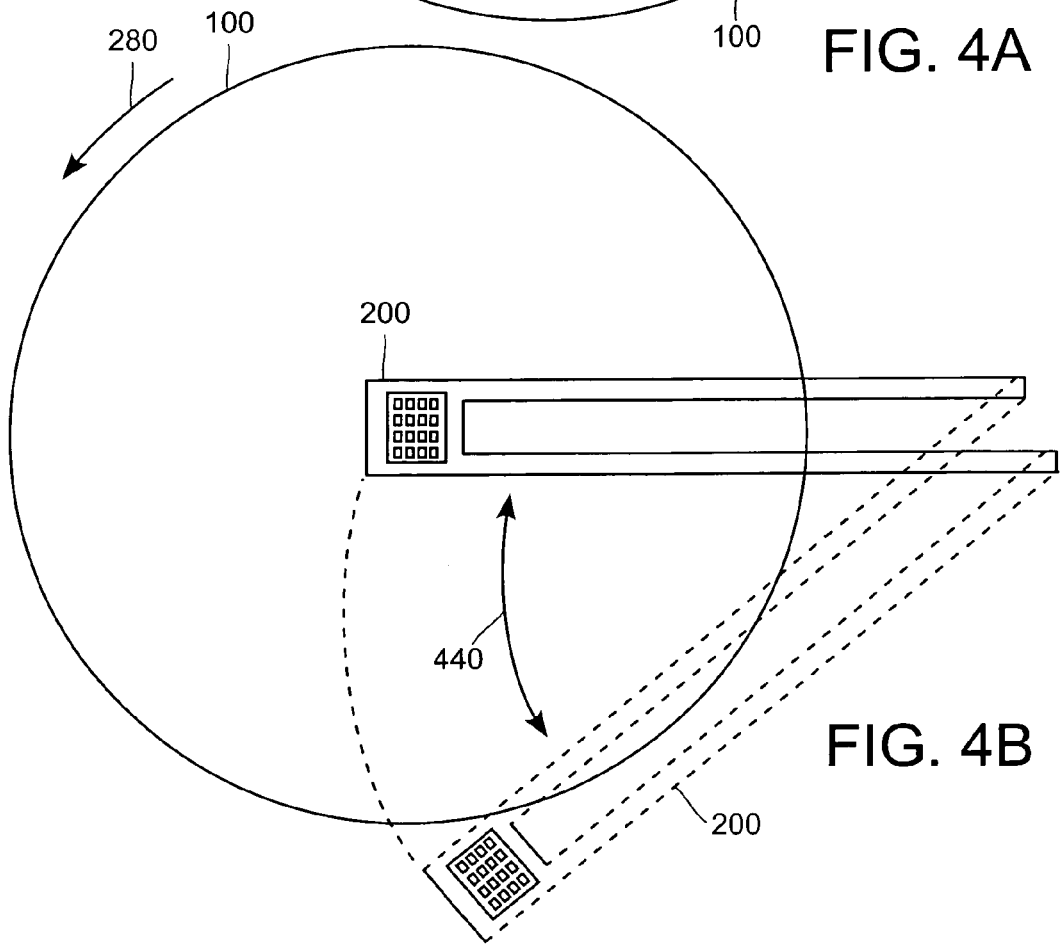
FIG. 4B is a diagram illustrating a proximity brush unit moving in a radial scan, in accordance with an embodiment of the invention.

Alternatively, FIG. 4B is a diagram illustrating a proximity brush unit moving in a radial scan, in accordance with an embodiment of the invention. PBU 200 starts in the center of wafer 100 and moves to an edge of wafer 100 using a radial scan 440. Radial scan 440 can have an arc from about 30 degrees to about 45 degrees. Further, as PBU 200 radially scans 440, brush 210 cleans wafer 100 followed by the stable fluid meniscus formed by plurality of ports 250. In alternative embodiments, PBU 200 can scan wafer 100 in a spiral scan, in a raster scan, or other scanning method ensuring full coverage of wafer 100 during wafer rotation 280.

Figure 5:
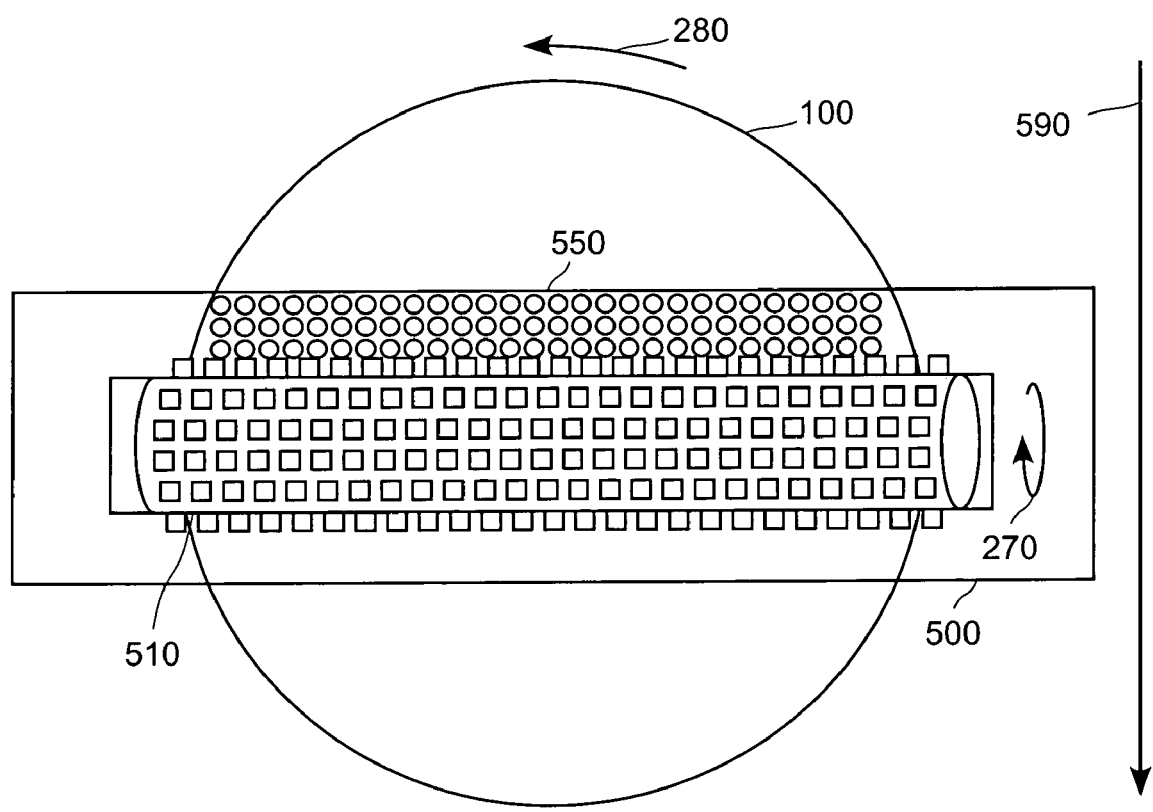
FIG. 5 is a diagram illustrating a top view of a proximity brush unit, in accordance with an embodiment of the invention.

FIG. 5 is a diagram illustrating a top view of a proximity brush unit, in accordance with an embodiment of the invention. A full diameter proximity brush unit 500 (FPBU) contains a full diameter brush 510. Full diameter brush 510 rotates with brush rotation 270 and cleans wafer 100. As FPBU 500 moves in the direction of a full linear scan 590, a linear plurality of ports 550 produces the stable fluid meniscus for drying the trailing edge of wafer 100. Alternatively, wafer 100 can move in the direction of full linear scan 590 while FPBU 500 remains stationary. In another embodiment, a combination of movement from wafer 100 and FPBU 500 is possible without departing from the intended purpose of cleaning and drying wafer 100.

Figure 6:
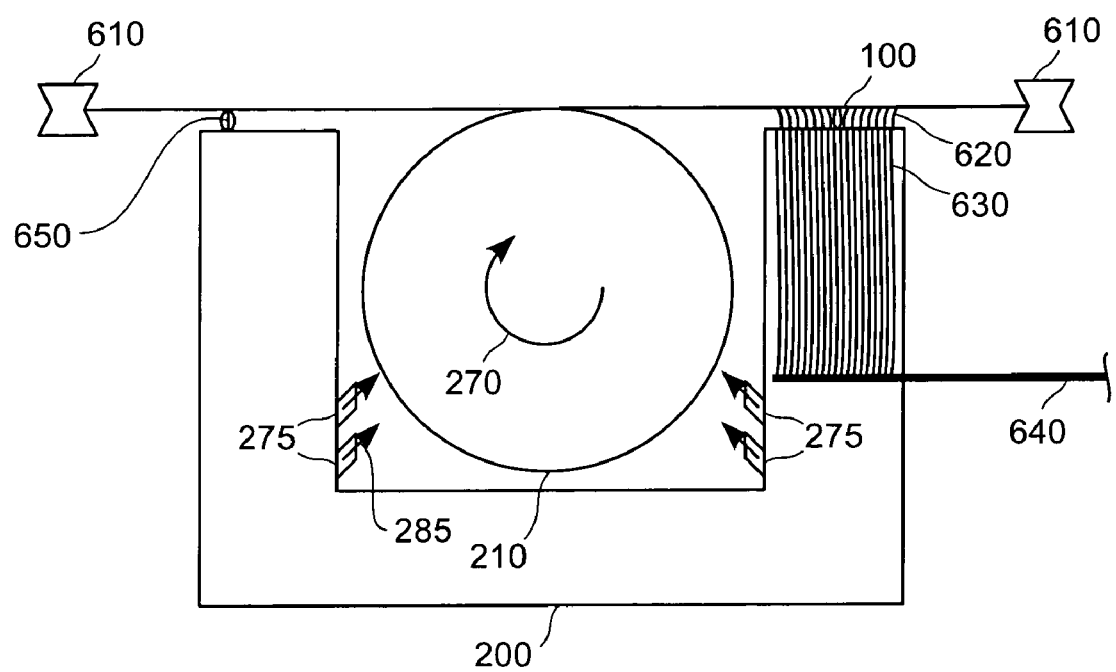
FIG. 6 is a diagram illustrating a side view of a proximity brush unit, in accordance with an embodiment of the invention.

FIG. 6 is a diagram illustrating a side view of a proximity brush unit, in accordance with an embodiment of the invention. PBU 200 applies a meniscus 620 from a plurality of conduits 630. To form meniscus 620, plurality of conduits 630 receives fluids from a fluid supply 640. Some or all of the plurality of conduits 630 can receive fluids, as long as PBU 200 applies meniscus 620 to the surface of wafer 100. Further, while wafer 100 rotates between two rollers 610, meniscus 620 has a height as shown by a proximate distance 650. Proximate distance 650 can be about 1.3 mm, but can also be any value in the range from about 0.5 mm to about 2.0 mm. However, as long as plurality of conduits 630 supplies controllable fluids proximate to the surface of wafer 100, any distance is appropriate without departing from the intended purpose of creating the stable fluid meniscus.

Figure 7:
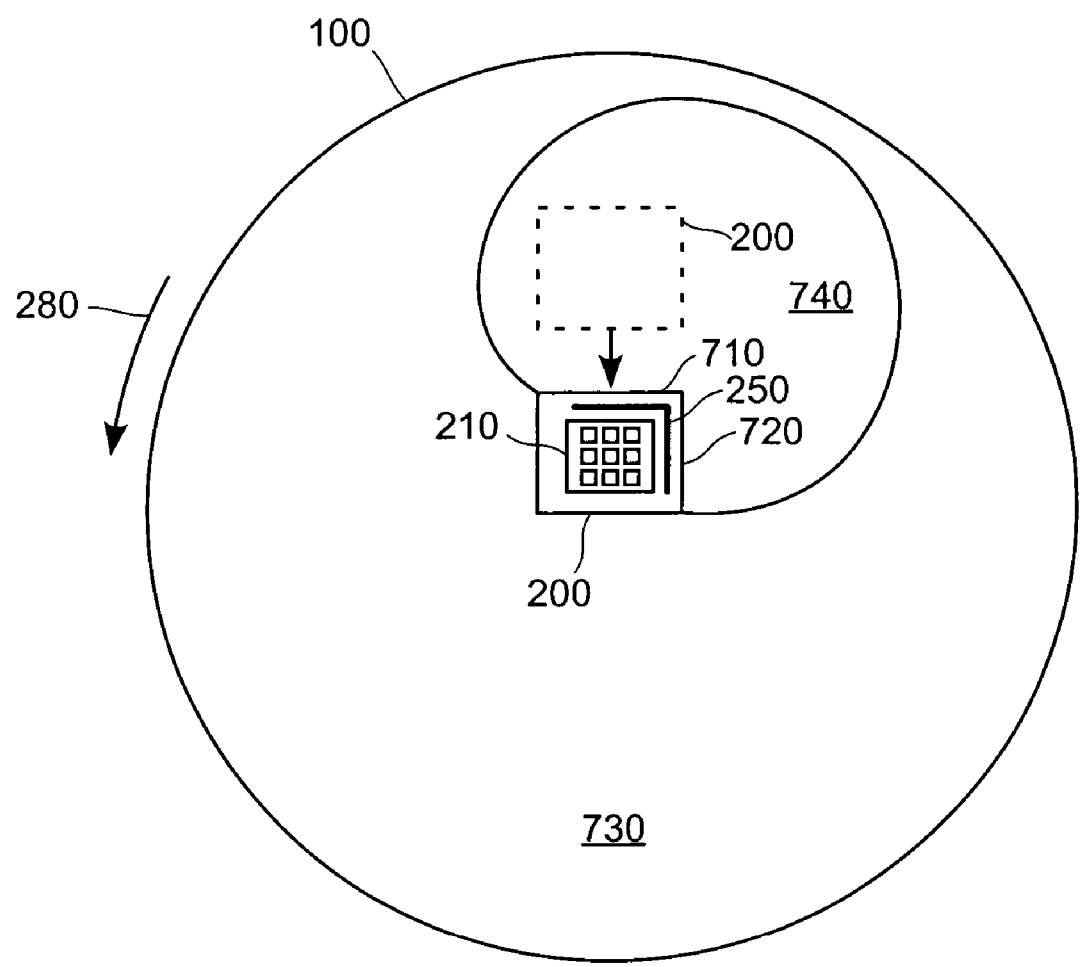
FIG. 7 is a diagram illustrating a proximity brush unit moving in a linear scan to produce a wet region and a dry region on a wafer, in accordance with an embodiment of the invention.

FIG. 7 is a diagram illustrating a proximity brush unit moving in a linear scan to produce a wet region and a dry region on a wafer, in accordance with an embodiment of the invention. As PBU 200 moves in a linear scan under wafer 100, the combined brush 210 and cleaning fluid 285 produces a wet region 730. Correspondingly, plurality of ports 250 produces meniscus 620 to produce a dry region 740. Specifically, PBU 200 produces dry region 740 when a PBU 200 trailing edge 720 moves past a wafer trailing edge 710. As previously disclosed, other scanning methods are possible, as long as PBU 200 first produces wet region 730 followed by dry region 740. In another embodiment (not shown), the wet region is formed on a leading edge of wafer 100 and the dry region is formed on a trailing edge of wafer 100.

Figure 8A:
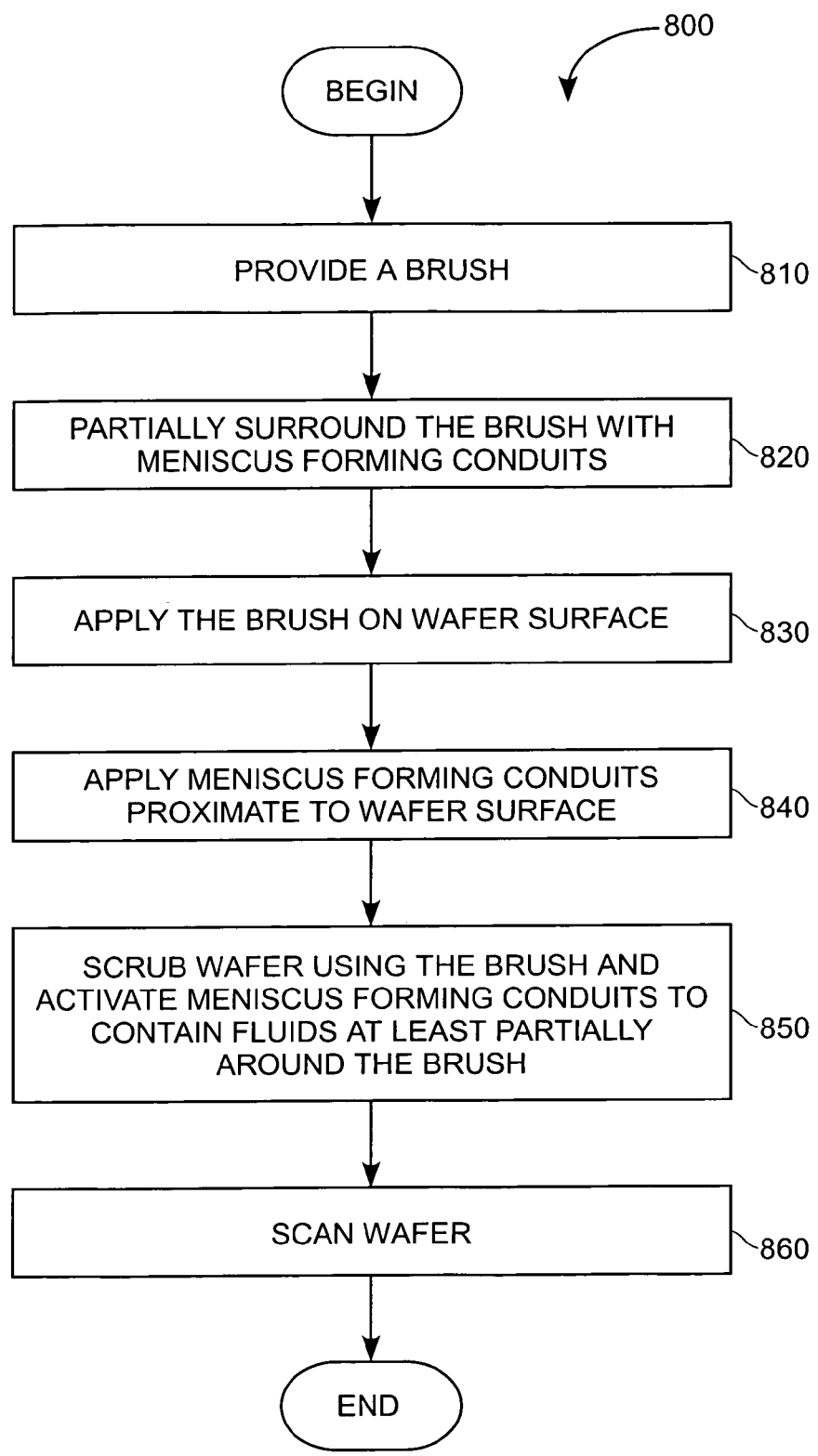
FIG. 8A is a diagram of a method for applying a proximity brush unit, in accordance with an embodiment of the invention.

FIG. 8A is a diagram of a method 800 for applying a proximity brush unit, in accordance with an embodiment of the invention. Method 800 begins by the proximity brush unit providing the brush to the wafer 100, in operation 810. Next in operation 820, meniscus 620 partially surrounds the brush with meniscus forming conduits 630. Then, in operation 830, the proximity brush unit applies the brush to the wafer surface. In a subsequent operation 840, the proximity brush unit applies the meniscus forming conduits 630 proximate to the wafer surface. The proximate brush unit then scrubs the wafer 100 using the brush and activates the meniscus forming conduits 630 to contain fluids at least partially around the brush, in operation 850. Finally, the proximity brush unit scans wafer 100 in operation 860, which ends method 800. In alternative embodiments, the proximity brush unit can be one of many embodiments previously described and can include other proximity brush unit shapes such as a cylinder or other polygonal shape.

Figure 8B:
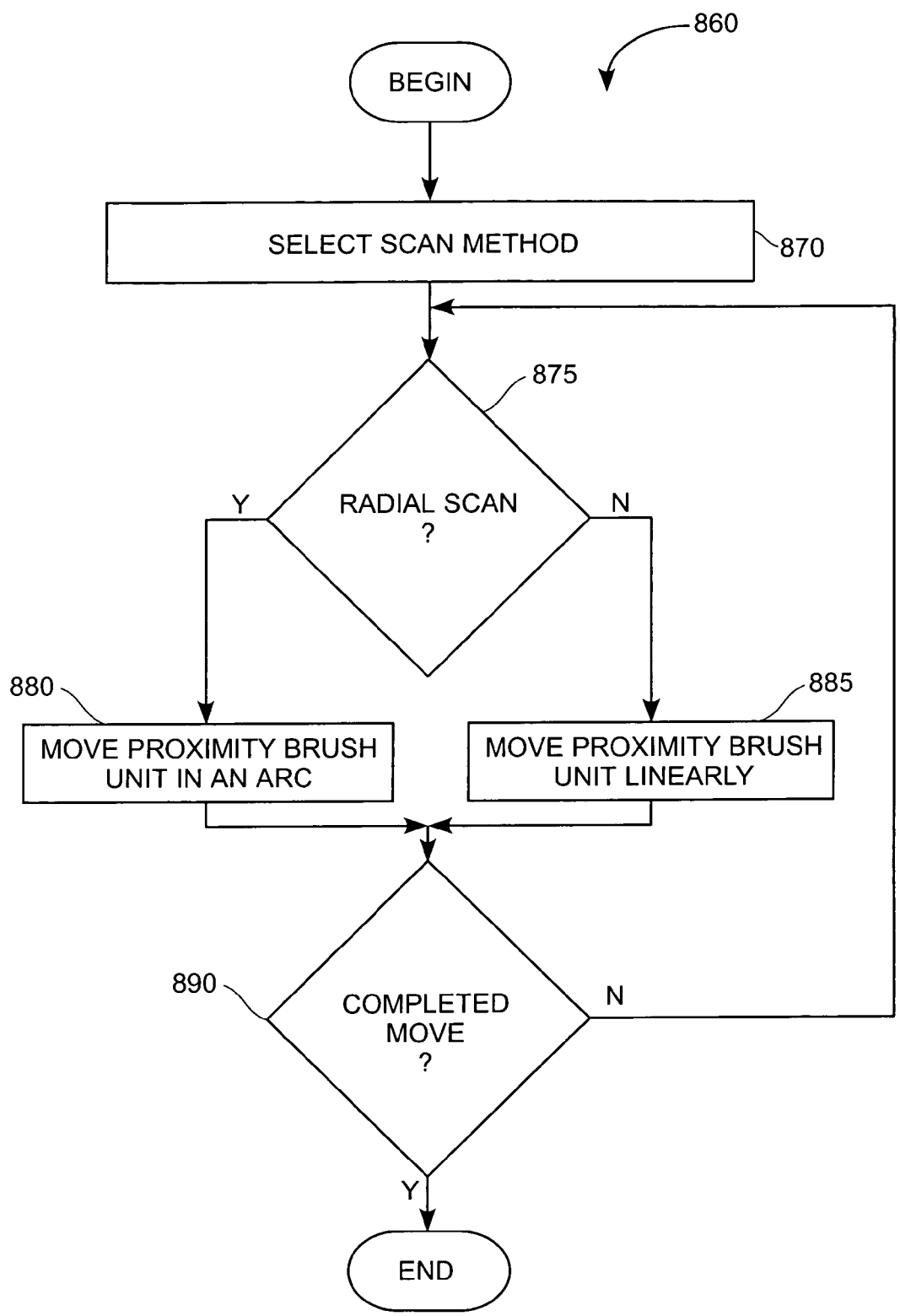
FIG. 8B is a diagram of a method for scanning a wafer with a proximity brush unit to produce a wet region and a dry region on the wafer, in accordance with an embodiment of the invention.

FIG. 8B is a diagram of a method, shown in operation 860, for scanning a wafer with a proximity brush unit to produce a wet region and a dry region on the wafer, in accordance with an embodiment of the invention. Operation 860 begins by selecting a scan method. In operation 875, if the selected scan method is a radial scan, then proceed to operation 880, which causes the movement of the proximity brush unit in an arc. Alternatively, in operation 885, the proximity brush unit moves linearly. In operation 890, upon the completed move of the proximity brush unit, the method ends. For other embodiments, any type of scanning method can replace the radial scan in operation 875. For example, the scanning methods can include linear scanning, spiral scanning or raster scanning. Accordingly, corresponding operations to move the proximity brush unit in the selected scan method follow operation 875.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of preparing a wafer surface, comprising the operations of:
   providing a brush mounted in a housing, the brush having a surface for scrubbing the wafer surface;
   partially surrounding the surface of the brush with a plurality of meniscus-forming ports in the housing;
   applying the plurality of meniscus-forming ports proximate to the wafer surface;
   scrubbing the wafer surface using the surface of the brush and simultaneously activating the plurality of meniscus-forming ports to form a meniscus on the wafer surface, wherein the meniscus contains fluids at least partially around the brush; and
   scanning the housing relative to the wafer surface so that the brush and the ports move across the wafer surface and the meniscus dries the wafer surface after the brush scrubs the wafer surface.

2. The method as recited in claim 1, wherein the scanning operation further comprises performing one of a radial scan, a linear scan, a spiral scan, and a raster scan.

3. The method as recited in claim 1, wherein the scanning operation further comprises moving the brush and the ports across the surface wafer so that the scrubbing and activating wet a region of the wafer surface and the meniscus then dries the wet region.

4. The method as recited in claim 1, wherein the operation of partially surrounding the surface of the brush with a plurality of meniscus-forming ports comprises the operations of:
   extending the ports in a first row along an edge of the housing; and
   extending the ports in a second row that completely surrounds the first row of ports.

5. The method as recited in claim 4, wherein the operation of extending the ports in the first row extends the first row in a straight row.

6. The method as recited in claim 4, wherein:
   the edge of the housing is a first edge and the housing has a second edge that intersects the first edge; and
   the operation of extending the ports in the first row extends the first row in an L-shape extending along the first and second edges.

7. The method as recited in claim 4, wherein:
   the edge of the housing is a first edge and the housing has a second edge that intersects the first edge; and
   the operation of extending the ports in the first row extends the first row in a U-shape extending along and between the first and second edges.

8. A method for preparing a surface of a wafer, comprising the operations of:
   scrubbing the surface of the wafer using a brush, the scrubbing comprising applying a first fluid to the surface of the wafer and using the brush and the first fluid to perform the scrubbing at a wet region on the surface of the wafer;
   generating a controlled meniscus on the surface of the wafer, the controlled meniscus at least partially surrounding the wet region scrubbed by the brush, the controlled meniscus being formed by applying at least a second fluid to the surface of the wafer and simultaneously removing the first fluid and the at least second fluid from the surface of the wafer by the controlled meniscus; and
   moving both the brush and the generated controlled meniscus relative to the surface of the wafer, such that the wet region on the surface of the wafer scrubbed by the brush and from which the fluids are removed by the generated controlled meniscus results in a dry region on the surface of the wafer.

9. The method as recited in claim 8, wherein the moving operation is in a direction such that the applying and scrubbing define the wet region on the surface of the wafer; and the scrubbing is followed by moving the controlled meniscus relative to the surface of the wafer, the controlled meniscus drying the wet region.

10. The method as recited in claim 8, wherein the moving operation further comprises scanning the surface of the wafer by the brush so that the scrubbing occurs on the wet region on the surface of the wafer and the scrubbing is followed by moving the controlled meniscus relative to the surface of the wafer, the controlled meniscus drying the wet region.

11. The method as recited in claim 10, wherein the moving further comprises the operation of rotating the wafer during the scanning of the surface of the wafer by the brush.

12. The method as recited in claim 8, wherein the operation of moving comprises:
   performing the scrubbing and the generating operations from a same proximity head; and
   moving the proximity head relative to the surface of water so that a trailing edge of the proximity head moves past a trailing edge of the wafer.

13. The method as recited in claim 8, wherein:
   the operation of generating the controlled meniscus at least partially surrounding the wet region comprises an operation of providing a plurality of meniscus-forming ports, including:
   extending the ports in a first row along one side of the brush; and
   extending the ports in a second row that completely surrounds the first row of ports;

the scrubbing operation further comprises providing the brush as a full diameter brush extending along the second row of ports; and the operation of moving comprises moving the brush and the plurality of the meniscus-forming ports relative to the surface of the wafer to form the wet region and performing the scrubbing at the wet region, followed by removal of the fluids by the controlled meniscus to form the dry region.

14. The method as recited in claim 8, wherein the generating operation comprises the operations of:

extending a plurality of ports in a first row along an edge of the brush; and extending the ports in a second row that completely surrounds the first row of ports.

15. The method as recited in claim 14, wherein the operation of extending the ports in the first row extends the first row in a straight row.

16. The method as recited in claim 14, wherein:

the edge of the brush is a first edge and the brush has a second edge that intersects the first edge; and the operation of extending the ports in the first row extends the first row in an L-shape extending along the first and second edges.

17. The method as recited in claim 14, wherein:

the edge of the brush is a first edge, the brush has a second edge that intersects the first edge, and the brush has a third edge that intersects the second edge; and the operation of extending the ports in the first row extends the first row in a U-shape extending along the first, second, and third edges.

* * * * *